(12) United States Patent
Hsiung et al.

(10) Patent No.: US 9,312,015 B1
(45) Date of Patent: Apr. 12, 2016

(54) METHODS FOR REDUCING BODY EFFECT AND INCREASING JUNCTION BREAKDOWN VOLTAGE

(71) Applicant: SANDISK TECHNOLOGIES INC., Plano, TX (US)

(72) Inventors: Chia-Lin Hsiung, Campbell, CA (US); Fumiaki Toyama, San Jose, CA (US); Masaaki Higashitani, Cupertino, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 26 days.

(21) Appl. No.: 14/523,848

(22) Filed: Oct. 25, 2014

(51) Int. Cl.
*G11C 16/04* (2006.01)
*G11C 16/24* (2006.01)

(52) U.S. Cl.
CPC ...................................... *G11C 16/24* (2013.01)

(58) Field of Classification Search
USPC .............. 365/185.17, 185.18, 185.28, 185.29
See application file for complete search history.

(56) References Cited

U.S. PATENT DOCUMENTS

| 2006/0038232 | A1 | 2/2006 | Kutsukake |
| 2008/0044973 | A1* | 2/2008 | Kalnitsky ............. G11C 27/005 438/264 |
| 2008/0298125 | A1 | 12/2008 | Taniwaki |
| 2014/0254242 | A1 | 9/2014 | Siau |
| 2014/0269100 | A1 | 9/2014 | Sel |

OTHER PUBLICATIONS

PCT International Search Report and Written Opinion of the International Searching Authority dated Nov. 16, 2015, PCT Application PCT/US2015/051283.

* cited by examiner

*Primary Examiner* — Hoai V Ho
(74) *Attorney, Agent, or Firm* — Vierra Magen Marcus LLP

(57) ABSTRACT

Methods for reducing an increase in the threshold voltage of a transistor due to the body effect and increasing the junction breakdown voltage for junctions of the transistor are described. The transistor may comprise an NMOS transistor that transfers a programming voltage (e.g., 24V) to a word line of a memory array during a programming operation. In some cases, a first poly shield may be positioned within a first distance of a gate of the transistor and may comprise a first polysilicon structure that is directly adjacent to the gate of the transistor. The first poly shield may be arranged in a first direction (e.g., in the channel length direction of the transistor). The first poly shield may be biased to a first voltage greater than ground (e.g., 10V) during the programming operation to reduce an increase in the threshold voltage of the transistor due to the body effect.

20 Claims, 9 Drawing Sheets

(Prior Art)

METHODS FOR REDUCING BODY EFFECT AND INCREASING JUNCTION BREAKDOWN VOLTAGE

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include reduced spacing between transistors and tighter design rule requirements.

DETAILED DESCRIPTION

Figure 1:
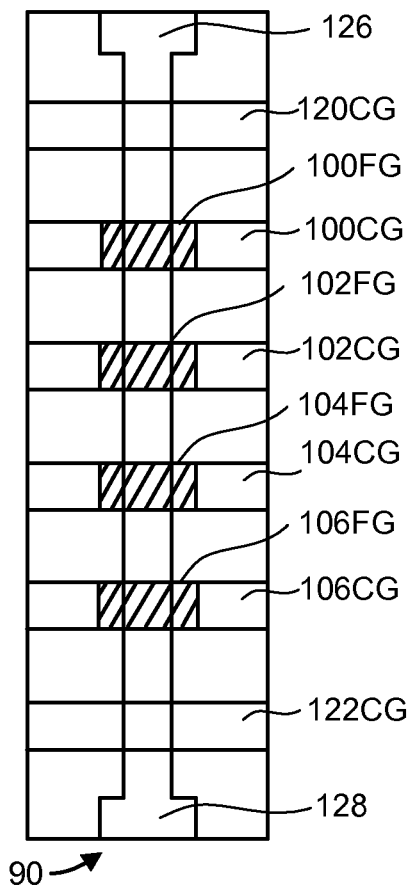
FIG. 1 depicts one embodiment of a NAND string.

Technology is described for reducing an increase in the threshold voltage of a transistor due to the body effect and/or increasing the junction breakdown voltage associated with junctions of the transistor by biasing polysilicon shields located next to the transistor. In one embodiment, the transistor may comprise a high voltage NMOS transistor that may transfer a high voltage to a power supply line or a signal line within an integrated circuit. In another embodiment, the transistor may comprise a word line switch transistor that may selectively transfer a voltage to a word line of a memory array during a memory operation. The memory operation may comprise a programming, erase, or read operation. The memory array may comprise a NAND memory array, a 3D NAND memory array (e.g., a bit cost scalable (BiCS) NAND structure), or a three-dimensional memory array (e.g., a 3D ReRAM memory array). The word line switch transistor may comprise an NMOS transistor that transfers a programming voltage (e.g., 24V) to the word line during a programming operation. In one embodiment, a first poly shield may be positioned within a first distance of a gate of the transistor and may comprise a first polysilicon structure that is directly adjacent to the gate of the transistor (e.g., the first polysilicon structure may be directly adjacent to the gate of the transistor such that no other polysilicon structure exists between a portion of the first poly shield and the gate of the transistor). A second poly shield may be positioned within a second distance of a source junction of the transistor. The first poly shield may be arranged in a first direction (e.g., in the channel length direction of the transistor) and the second poly shield may be arranged in a second direction that is orthogonal to the first direction (e.g., in the channel width direction of the transistor). During a memory operation, the first poly shield may be biased to a first voltage (e.g., 10V) to reduce an increase in threshold voltage due to the body effect and to increase the junction breakdown voltage between the source junction and a neighboring junction the second poly shield may be biased to a second voltage less than the first voltage (e.g., 0V) to prevent field punch-through between the source junction and the neighboring junction. The second voltage may be set to prevent field punch-through (FPT) caused by a parasitic transistor formed between the source junction and the neighboring junction of a neighboring transistor.

In some embodiments, one or more polysilicon shields (or poly shields) may be positioned adjacent to a polysilicon gate of a transistor. In one example, a first poly shield may be located on a first side of the polysilicon gate and a second poly shield may be located on a second side of the polysilicon gate. Both the first poly shield and the second poly shield may be arranged in a first direction (e.g., in the channel length direction of the transistor in which current flows from a drain of the transistor to the source of the transistor). The first poly shield and the second poly shield may be set to a first voltage (e.g., 10V) in order to reduce a body effect of the transistor when transferring a voltage onto a word line during a memory operation. In some cases, the voltage applied to the first poly shield and the second poly shield may depend on the type of memory operation being performed. In one example, if the memory operation comprises a programming operation, then the first poly shield and the second poly shield may be set to a first voltage (e.g., 10V). However, if the memory operation comprises a read operation, then the first poly shield and the second poly shield may be set to a second voltage less than the first voltage (e.g., 4V). In one embodiment, the voltage applied to the first poly shield and the second poly shield may be set based on the highest voltage being transferred to a word line in a memory array. Applying a voltage to the first and second poly shields may cause depletion regions to be formed under the poly shields, which may counteract and reduce the body effect caused by application of a source-bulk voltage. In some cases, the first poly shield does not comprise a gate of a transistor (i.e., a transistor channel does not exist under the first poly shield).

In one embodiment, a poly shield may be arranged next to a polysilicon gate of a transistor. The transistor may comprise a word line switch transistor used for transferring a voltage to a word line of a memory array during a memory operation. During a programming operation, the word line switch transistor may transfer a programming voltage (e.g., VPGM), a pass voltage (e.g., VPASS), or an isolation voltage (e.g., VISO) onto the word line. During a read operation, the word line switch transistor may transfer a read voltage (e.g., 5V) onto the word line.

One issue affecting a word line switch transistor during a programming operation may include an increased threshold voltage due to the body effect (or body-bias effect) when the word line switch transistor is transferring a high programming voltage onto a word line (e.g., the threshold voltage may increase by 3V when transferring 24V to the word line). In the case that the word line switch transistor comprises an NMOS transistor, the threshold voltage may increase because the application of a source-bulk voltage may reverse bias the p-substrate/n-junction boundary at the source junction of the NMOS transistor, which may increase the bulk depletion charge (similar to the increase in depletion charge in a PN junction when the junction is reverse biased). An increase in the threshold voltage of the word line switch transistor may result in a higher gate voltage needing to be applied to the gate of the word line switch transistor in order to fully transfer the high programming voltage to the word line. Generating a higher gate voltage may require an increase in the maximum chip voltage and/or an increase in the chip area for implementing charge pumps for generating the maximum chip voltage.

In some cases, the layout of a set of word line switch transistors for driving word lines associated with a particular memory block may be arranged such that whenever a first transistor is setting a first word line to a programming voltage that each of the neighboring transistors of the first transistor are setting their respective word lines to voltages greater than a particular voltage (e.g., if the programming voltage is 24V, then none of the neighboring transistors of the first transistor will be transferring a voltage less than 8V). To prevent field punch-through caused by a parasitic transistor formed between a source junction of the first transistor and a neighboring junction of a neighboring word line switch transistor associated with a second memory block different from the particular memory block, a poly shield may be located between the first transistor and the neighboring transistor and biased to a second voltage (e.g., 0V). In this case, the source junction of the first transistor may be set to a programming voltage (e.g., 24V) and the neighboring junction of the neighboring transistor in the different memory block may be set to an isolation voltage (e.g., 0V) causing a large voltage gradient between the two junctions. In some cases, this situation may never occur among the set of word line switch transistors associated with a particular memory block due to transistor layout or placement of the word line switch transistors. In one example, the transistor layout may guarantee that a first word line transistor that is transferring a programming voltage is never adjacent to or next to a second word line transistor that is transferring an isolation voltage.

In situations where the arrangement of word line switch transistors has relieved the constraints associated with field punch-through, the poly shields interdigitated with or arranged next to the word line switch transistors may be set to higher voltages in order to reduce the increase in threshold voltages due to the body effect. The benefits of biasing poly shields to reduce the increase in threshold voltages due to the body effect and to increase the junction breakdown voltages for transistors may include a reduced maximum chip voltage, a reduced charge pump area, a reduced transistor junction spacing, and a smaller die size.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells).

The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

Figure 2:
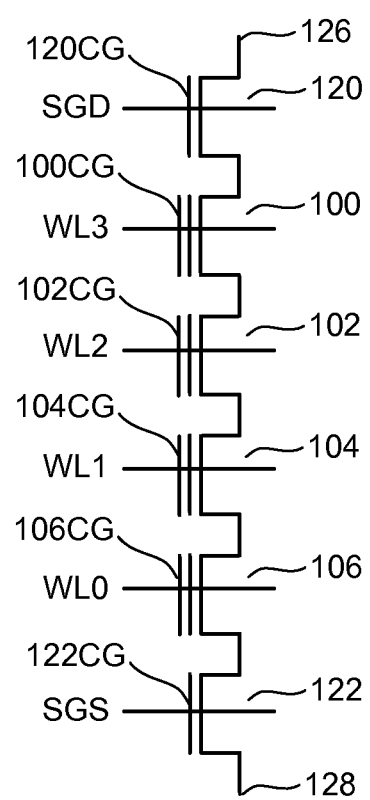
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
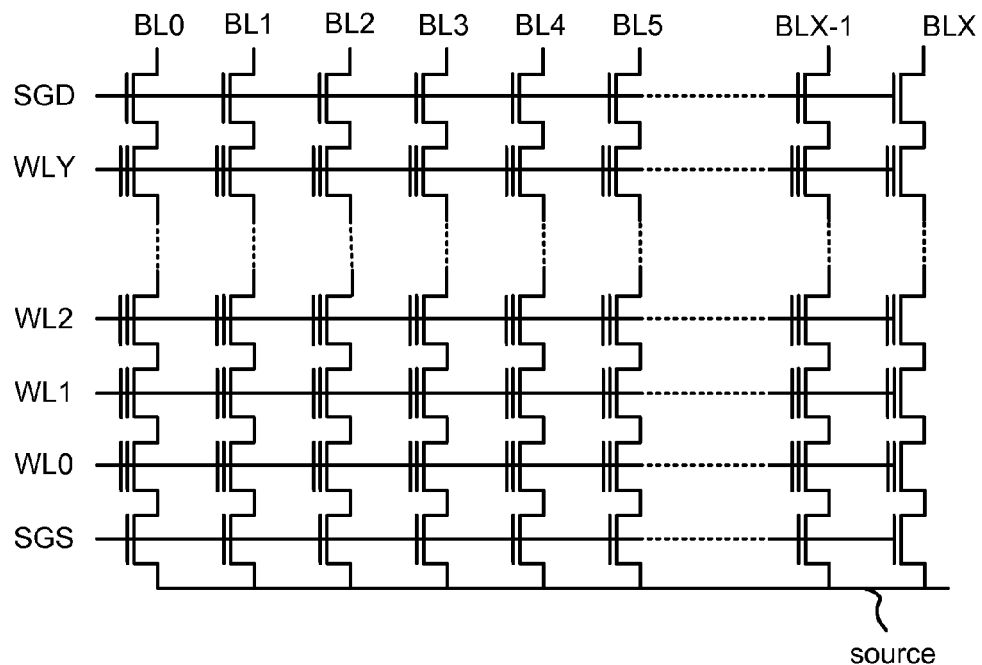
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may be fabricated using the technology described herein.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

In one embodiment, when programming a memory cell, such as a NAND flash memory cell, a program voltage may be applied to the control gate of the memory cell and the corresponding bit line may be grounded. These programming bias conditions may cause electrons to be injection into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
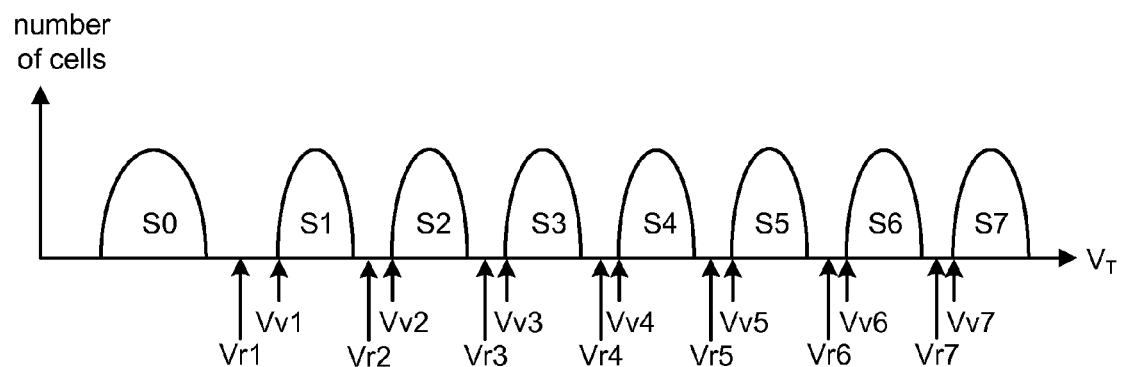
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4:
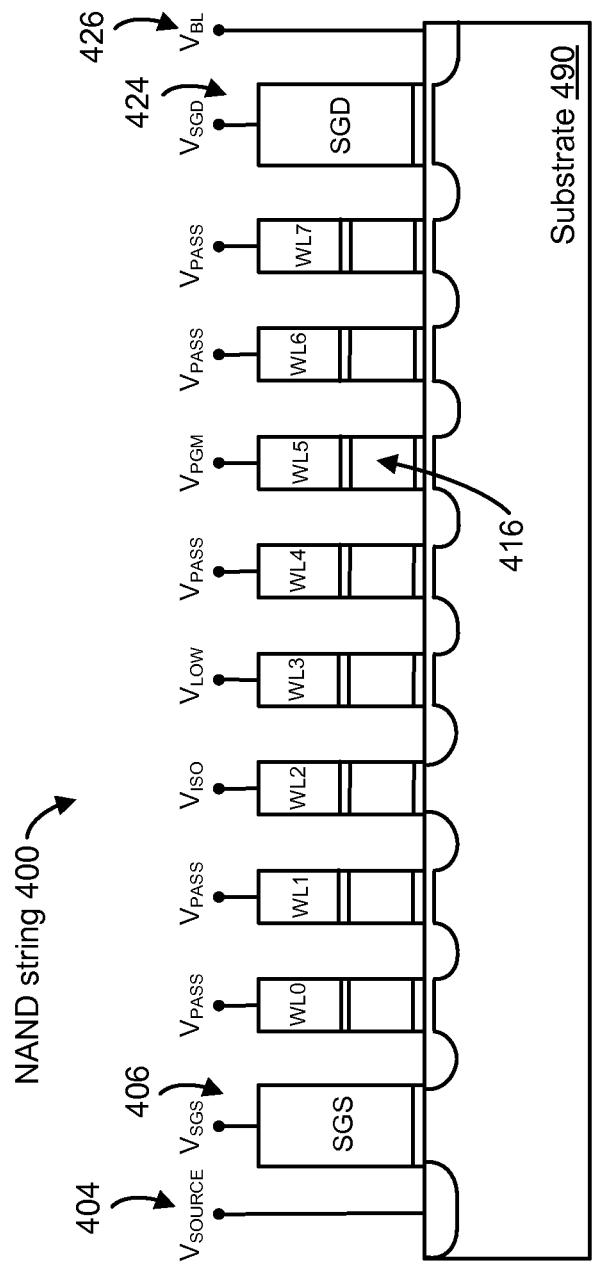
FIG. 4 depicts one embodiment of a NAND string during a programming operation.

FIG. 4 depicts one embodiment of a NAND string 400 during a programming operation. When programming a storage element (e.g., the storage element associated with WL5) of the NAND string 400, a program voltage may be applied to a word line associated with the storage element and a low voltage (e.g., ground) may be applied to the bit line associated with the storage element. As depicted, the NAND string 400 includes a source-side select gate 406, a drain-side select gate 424, and eight word lines WL0-WL7 formed above a substrate 490. $V_{SGS}$ may be applied to the source-side select gate 406 and $V_{SGD}$ may be applied to the drain-side select gate 424. The bit line 426 may be biased to VBA and the source line 404 may be biased to $V_{SOURCE}$. During a programming operation, a programming voltage, $V_{PGM}$, may be applied to selected word line WL5, which is associated with a selected storage element 416.

In one example of a boosting mode, when storage element 416 is the selected storage element, a relatively low voltage, $V_{LOW}$, e.g., 2-6 V, may be applied to a neighboring source-side word line (WL3), while an isolation voltage, $V_{ISO}$, e.g., 0-4 V, may be applied to another source-side word line (WL2), referred to as an isolation word line and a pass voltage, VPASS, may be applied to the remaining word lines associated with NAND string 400 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than VPASS which is less than $V_{PGM}$.

Figure 5:
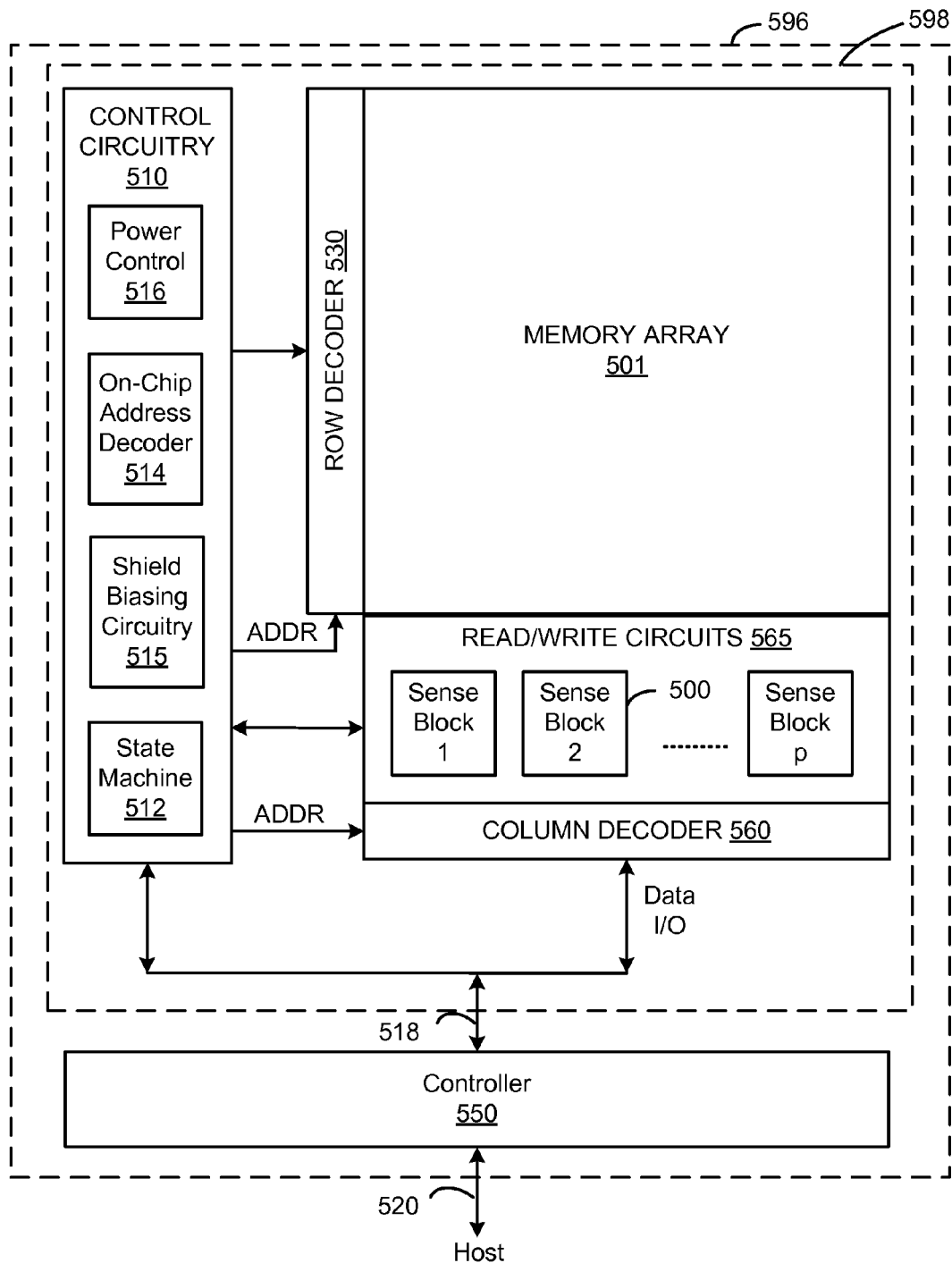
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

The control circuitry 510 includes shield biasing circuitry 515 for biasing polysilicon shields (e.g., polysilicon shield 754 in FIG. 7E) during a memory operation. The shield biasing circuitry 515 may include voltage regulators for generating voltages to be applied to the polysilicon shields and select transistors for setting a first set of polysilicon shields to a first voltage (e.g., 10V) and setting a second set of polysilicon shield to a second voltage (e.g., 0V) different from the first voltage. In some cases, an analog mux may be used to select one voltage out of a number of reference voltages to apply to a polysilicon shield. The analog mux may be used to transfer an analog voltage or a reference voltage to the polysilicon shield prior to a memory operation being performed and/or during the memory operation. The shield biasing circuitry 515 may include a shield biasing control circuit that may be configured to select a particular voltage to be applied to a polysilicon shield during a memory operation and may be configured to apply the particular voltage to the polysilicon shield during the memory operation. The shield biasing control circuit may include an analog mux. The particular voltage to be applied to the polysilicon shield may depend on the type of memory operation to be performed.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
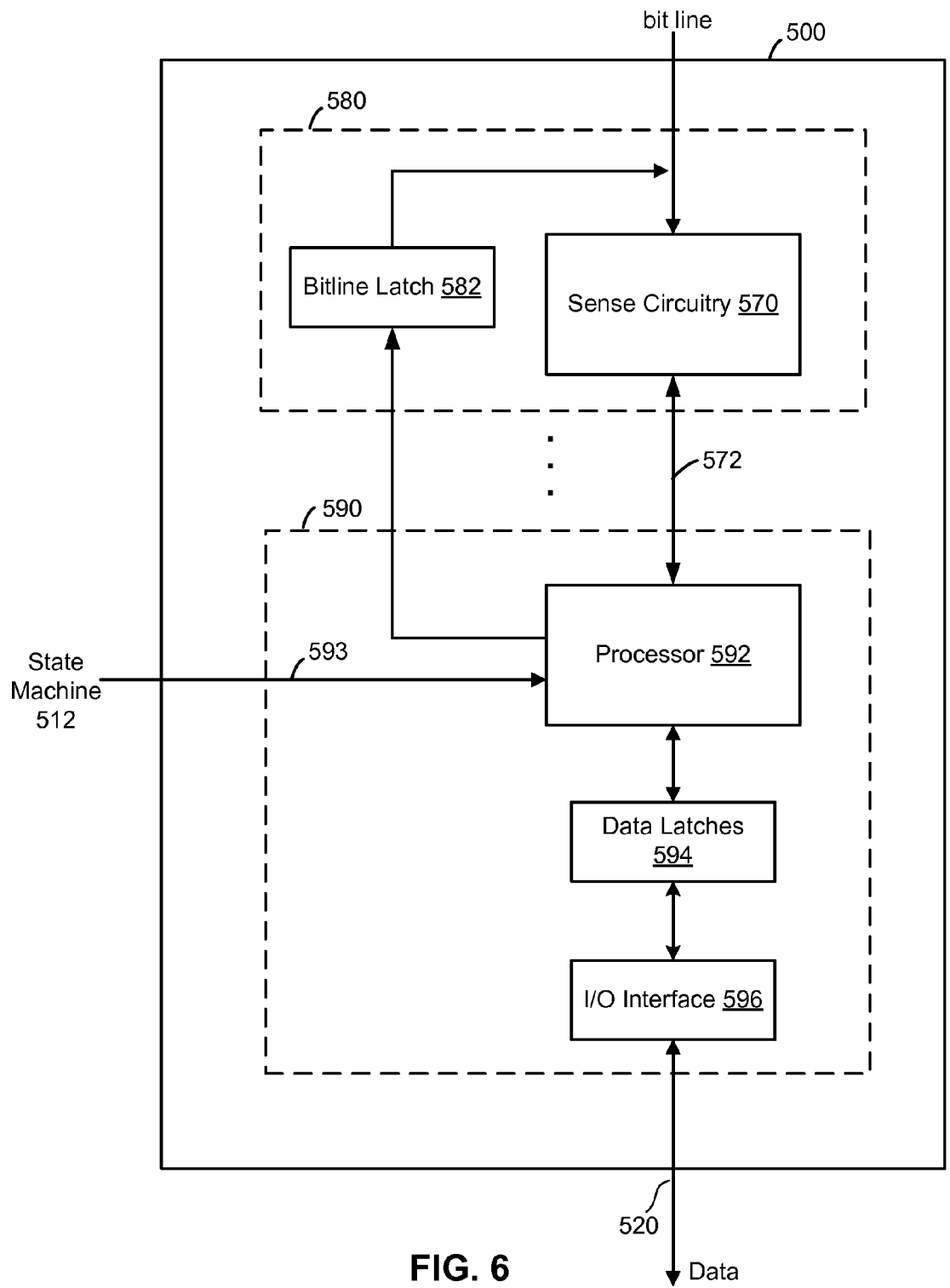
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
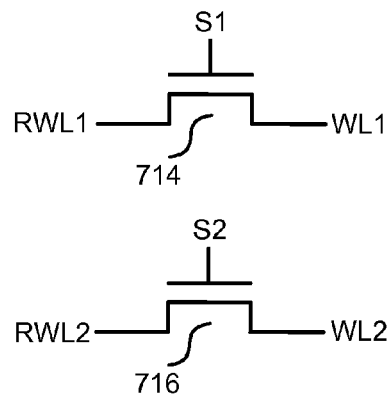
FIG. 7A depicts one embodiment of a schematic view of a first transistor and a second transistor.

FIG. 7A depicts one embodiment of a schematic view of a first transistor 714 and a second transistor 716. The gate of the first transistor 714 is connected to node S1, which may be biased in order to selectively enable or disable conduction between a drain of the first transistor and a source of the first transistor. The drain of the first transistor is connected to node RWL1. In the case that the first transistor 714 is placed into a conducting state (i.e., the first transistor is turned-on), then the voltage applied to node RWL1 may be transferred to the source of the first transistor. The source of the first transistor is connected to node WL1, which may be connected to a first word line of a memory array. The memory array may comprise a NAND memory array. The first transistor 714 may comprise a first word line switch transistor.

The gate of the second transistor 716 is connected to node S2, which may be biased in order to selectively enable or disable conduction between a drain of the second transistor and a source of the second transistor. The drain of the second transistor is connected to node RWL2. In the case that the second transistor 716 is placed into a conducting state (i.e., the second transistor is turned-on), then the voltage applied to node RWL2 may be transferred to the source of the second transistor. The source of the second transistor is connected to node WL2, which may be connected to a second word line of a memory array. The second transistor 716 may comprise a second word line switch transistor.

Figure 7B:
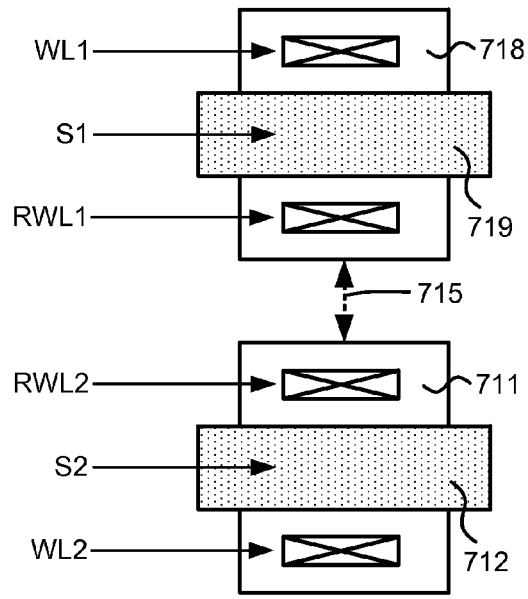
FIG. 7B depicts one embodiment of a layout view of the first transistor and the second transistor depicted in FIG. 7A.

FIG. 7B depicts one embodiment of a layout view of the first transistor 714 and the second transistor 716 in FIG. 7A. The layout view may comprise a top plan view in which masking layers (e.g., a diffusion masking layer and a polysilicon masking layer) may be viewed in a top-down manner. Each of the masking layers may be parallel to a substrate. As depicted, the layout of the first transistor 714 of FIG. 7A includes a diffusion layer 718 and a polysilicon layer 719. In some cases, the diffusion layer 718 may be formed using a diffusion masking layer and the polysilicon layer 719 may be formed using a polysilicon masking layer. Physical layers (e.g., a polysilicon layer) comprising parts of a transistor (e.g., a polysilicon gate of the transistor) may be formed using one or more photolithographic masks.

In one embodiment, where the polysilicon layer 719 overlaps the diffusion layer 718, a transistor channel of the first transistor 714 may be formed. The node S1 of FIG. 7A may be connected to the polysilicon layer 719, the node RWL1 of FIG. 7A corresponding with a drain of the first transistor 714 may be connected to a first portion of the diffusion layer 718 on a first side of the polysilicon layer 719, and the node WL1 of FIG. 7A corresponding with a source of the first transistor 714 may be connected to a second portion of the diffusion layer 718 on a second side of the polysilicon layer 719. In some cases, a first contact may be used to connect a first metal line to the first portion of the diffusion layer 718 and a second contact may be used to connect a second metal line to the second portion of the diffusion layer 718. The second metal line may comprise a first word line of a memory array.

The layout of the second transistor 716 of FIG. 7A includes a diffusion layer 711 and a polysilicon layer 712. Where the polysilicon layer 712 overlaps the diffusion layer 711, a transistor channel of the second transistor 716 may be formed. The node S2 of FIG. 7A may be connected to the polysilicon layer 712, the node RWL2 of FIG. 7A corresponding with a drain of the second transistor 716 may be connected to a first portion of the diffusion layer 711 on a first side of the polysilicon layer 712, and the node WL2 of FIG. 7A corresponding with a source of the second transistor 716 may be connected to a second portion of the diffusion layer 711 on a second side of the polysilicon layer 712. In some cases, a first contact may be used to connect a first metal line to the first portion of the diffusion layer 711 and a second contact may be used to connect a second metal line to the second portion of the diffusion layer 711. The second metal line may comprise a second word line of a memory array.

In one embodiment, the first transistor 714 may comprise a first word line switch transistor for transferring a first voltage (e.g., a programming voltage) to a first word line of a memory array and the second transistor 716 may comprise a second word line switch transistor for transferring a second voltage (e.g., a pass voltage) to a second word line of the memory array. In some cases, both the first word line and the second word line may be part of the same memory block.

Figure 7C:
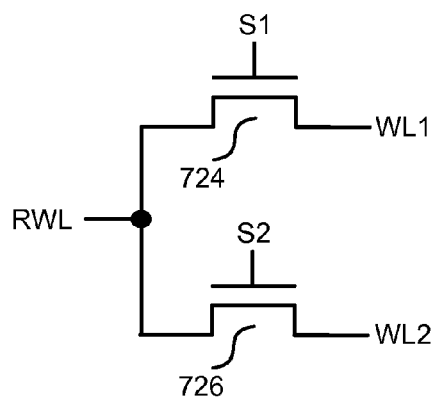
FIG. 7C depicts one embodiment of a schematic view of a first transistor and a second transistor.

FIG. 7C depicts one embodiment of a schematic view of a first transistor 724 and a second transistor 726. In one embodiment, the first transistor 724 and the second transistor 726 may implement a demultiplexer. The gate of the first transistor 724 is connected to node S1, which may be biased in order to selectively enable or disable conduction between a drain of the first transistor and a source of the first transistor. The drain of the first transistor is connected to node RWL. In the case that the first transistor 724 is placed into a conducting state (i.e., the first transistor is turned-on), then the voltage applied to node RWL may be transferred to the source of the first transistor. The source of the first transistor is connected to node WL1, which may be connected to a first word line of a memory array. The first transistor 724 may comprise a first word line switch transistor.

The gate of the second transistor 726 is connected to node S2, which may be biased in order to selectively enable or disable conduction between a drain of the second transistor and a source of the second transistor. The drain of the second transistor is also connected to node RWL (as the drains of the first transistor 724 and the second transistor 726 have been shorted together). In the case that the second transistor 726 is placed into a conducting state (i.e., the second transistor is turned-on), then the voltage applied to node RWL may be transferred to the source of the second transistor. The source of the second transistor is connected to node WL2, which may be connected to a second word line of a memory array. The second transistor 726 may comprise a second word line switch transistor.

Figure 7D:
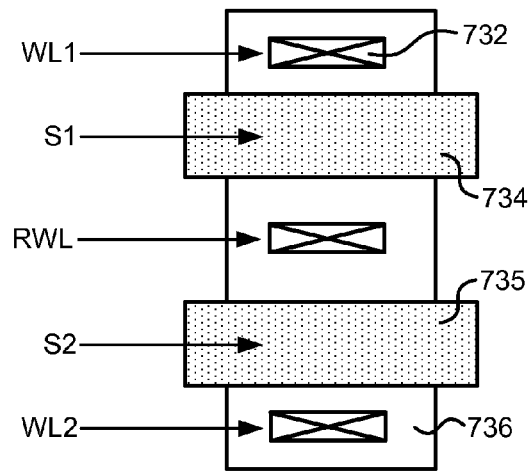
FIG. 7D depicts one embodiment of a layout view of the first transistor and the second transistor depicted in FIG. 7C.

FIG. 7D depicts one embodiment of a layout view of the first transistor 724 and the second transistor 726 in FIG. 7C. The layout view may comprise a top plan view in which masking layers (e.g., a diffusion masking layer and a polysilicon masking layer) may be viewed in a top-down manner. Each of the masking layers may be parallel to a substrate. As depicted, the layout of the first transistor 724 of FIG. 7C includes a diffusion layer 736, a first polysilicon layer 734, and a second polysilicon layer 735. Where the first polysilicon layer 734 overlaps the diffusion layer 736, a transistor channel of the first transistor 724 may be formed. Where the second polysilicon layer 735 overlaps the diffusion layer 736, a transistor channel of the second transistor 726 may be formed. The node S1 of FIG. 7C may be connected to the first polysilicon layer 734, the node RWL of FIG. 7C corresponding with a drain of the first transistor 724 may be connected to a first portion of the diffusion layer 736 on a first side of the first polysilicon layer 734, and the node WL1 of FIG. 7C corresponding with a source of the first transistor 724 may be connected to a second portion of the diffusion layer 736 on a second side of the first polysilicon layer 734. In some cases, a contact 732 may be used to connect a second metal line to the second portion of the diffusion layer 736 and a different contact may be used to connect a first metal line to the first portion of the diffusion layer 736. The second metal line may comprise a word line of a memory array.

The node S2 of FIG. 7C may be connected to the second polysilicon layer 735, the node RWL of FIG. 7C corresponding with a drain of the second transistor 726 may be connected to the first portion of the diffusion layer 736, and the node WL2 of FIG. 7C corresponding with a source of the second transistor 726 may be connected to a third portion of the diffusion layer 736 on a first side of the polysilicon layer 735. In some cases, a third contact may be used to connect a third metal line to the third portion of the diffusion layer 736. The third metal line may comprise a second word line of the memory array.

In one embodiment, the first transistor 724 may comprise a first word line switch transistor for transferring a first voltage (e.g., a programming voltage) to a first word line and the second transistor 726 may comprise a second word line switch transistor for transferring the first voltage to a second word line. In some cases, the first word line may be part of a first memory block and the second word line may be part of a second memory block different from the first memory block. In cases where the first transistor 724 and the second transistor 726 share a diffusion region, the first memory block may be enabled while the second memory block is disabled. One benefit of sharing the diffusion region that is connected to node RWL is that the first transistor 724 and the second transistor 726 may be implemented using a smaller layout area (e.g., the diffusion to diffusion spacing 715 in FIG. 7B has been eliminated).

Figure 7E:
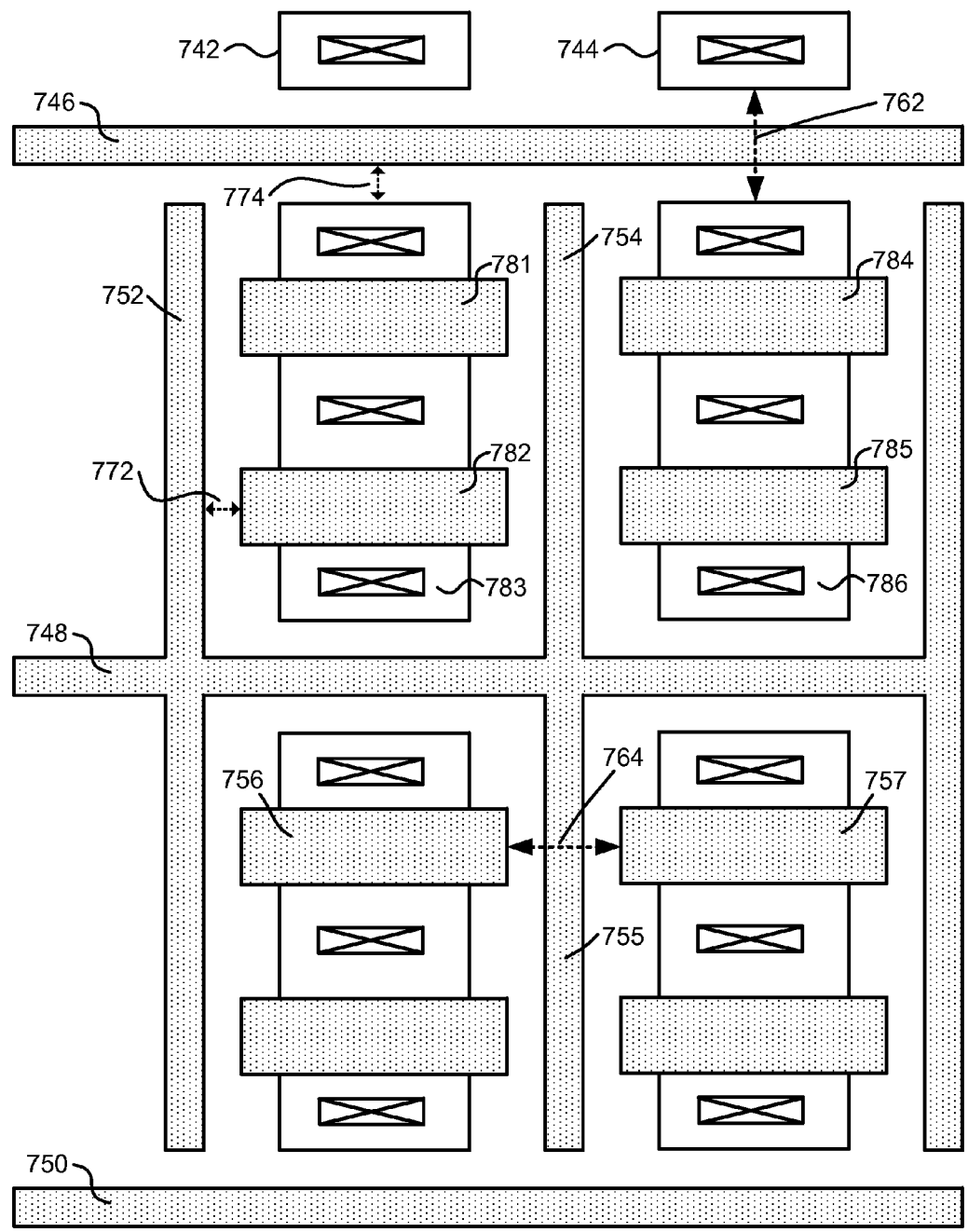
FIG. 7E depicts one embodiment of a layout view including polysilicon shields.

FIG. 7E depicts one embodiment of a layout view including a first set of polysilicon shields 748 and a second set of polysilicon shields 746. The layout view may comprise a top plan view in which masking layers (e.g., portions of a diffusion masking layer and portions of a polysilicon masking layer) may be viewed in a top-down manner. Each of the masking layers may be parallel to a substrate. As depicted, the layout includes diffusion layers 783 and 786 (e.g., diffusion layers associated with transistors connected to word lines in a first memory block) and diffusion layers 742 and 744 (e.g., diffusion layers associated with transistors connected to word lines in a second memory block). The diffusion layer 786 may be separated from the diffusion layer 744 by a diffusion to diffusion spacing 762. The diffusion to diffusion spacing 762 may be set based on a maximum voltage gradient between the diffusion layer 786 and the diffusion layer 744. From the perspective of the layout view, the second set of polysilicon shields 746 may be positioned between the diffusion layer 786 and the diffusion layer 744. In some embodiments, the second set of polysilicon shields 746 may be biased to a second voltage (e.g., 0V) during a memory operation (e.g., a programming operation) in order to prevent field punch-through between a junction associated with the diffusion layer 786 and a neighboring junction associated with the diffusion layer 744. During a read operation, the second set of polysilicon shields 746 may be biased to a third voltage different from the second voltage used during a programming operation (e.g., the second set of polysilicon shields 746 may be biased to 2V during the read operation and 0V during the programming operation). The polysilicon shield 746 may be positioned within a poly to diffusion spacing 774. The polysilicon shield 746 may be positioned within a second distance of a source junction of the transistor formed by the overlap of polysilicon layer 781 and diffusion layer 783.

The polysilicon layers 781 and 782 appear to overlap the diffusion layer 783 as during fabrication the diffusion layers may be formed before the polysilicon layers are formed. In one example, polysilicon structures (e.g., poly shields and polysilicon gates of transistors) made using polysilicon masks may be formed above diffusion structures (e.g., transistor junctions) made using diffusion masks. In some cases, the poly shields and the polysilicon gates of transistors may be formed using common fabrication steps or processing steps. The poly shields and the polysilicon gates of transistors may be deposited and then etched using the same processing steps.

Diffusion layer 786 and polysilicon layers 784 and 785 may be used to form a first pair of transistors. Diffusion layer 783 and polysilicon layers 781 and 782 may be used to form a second pair of transistors. In some cases, a first finger or portion 752 of the first set of polysilicon shields 748 may be arranged in a first direction that is parallel to a transistor channel length of a transistor formed using the polysilicon layer 782 and the diffusion layer 783. The portion 752 of the first set of polysilicon shields 748 may be positioned within a first distance of the polysilicon layer 782. In one example, the portion 752 may comprise a polysilicon shield that is positioned within a first distance of the polysilicon layer 782. The polysilicon shield may be separated from the polysilicon layer 782 by a poly to poly spacing 772.

In one embodiment, the first set of polysilicon shields 748 may include a first polysilicon shield 752 and a second polysilicon shield 754. The first polysilicon shield 752 may be arranged in a first direction and the polysilicon shield 754 may also be arranged in the first direction. The first direction may correspond with a channel length direction of a transistor formed using polysilicon layer 782.

In some cases, the first polysilicon shield 752 and the second polysilicon shield 754 may be positioned adjacent to a polysilicon gate of a transistor associated with the polysilicon layer 782. The first polysilicon shield 752 may be located on a first side of the polysilicon gate and the second polysilicon shield 754 may be located on a second side of the polysilicon gate. The first polysilicon shield 752 and the second polysilicon shield 754 may be set to a first voltage (e.g., 10V) in order to reduce a body effect of the transistor associated with the polysilicon gate. The first voltage may be greater than 0V. The first voltage may be applied to the first polysilicon shield 752 and the second polysilicon shield 754 during a memory operation, such as a write operation. In some cases, the first voltage applied to the first polysilicon shield 752 and the second polysilicon shield 754 may depend on the type of memory operation being performed (e.g., the voltage applied to the poly shields may depend on whether the memory operation comprises a read operation or a write operation).

As depicted in FIG. 7E, a first polysilicon gate 756 is separated from a second polysilicon gate 757 by a distance 764. Located between the first polysilicon gate 756 and the second polysilicon gate 757 is a polysilicon shield 755. The polysilicon shield 755 is positioned directly adjacent to the polysilicon gate 756 (e.g., there is no intervening polysilicon structure between the polysilicon gate 756 and the polysilicon shield 755). The polysilicon shield 755 is positioned directly adjacent to the polysilicon gate 757 (e.g., there is no intervening polysilicon structure between the polysilicon gate 757 and the polysilicon shield 755). The polysilicon gate 756, the polysilicon gate 757, and the polysilicon shield 755 may be formed during fabrication using the same processing steps (e.g., using the same deposition and etching steps).

In some cases, the first set of polysilicon shields 748 may be interdigitated between polysilicon gates associated with word line switch transistors for driving word lines associated with a memory block. The second set of polysilicon shields 746 and a third polysilicon shield 750 may be located above and below the layout of the word line switch transistors. The second set of polysilicon shields 746 and the third polysilicon shield 750 may be set to ground during a memory operation in order to prevent field punch-through between junctions associated with the word line switch transistors and other junctions associated with transistors located outside of the word line switch transistors. In one embodiment, the first set of polysilicon shields 748 may be set to a first voltage during a memory operation and the second set of polysilicon shields 746 may be set to a second voltage different from the first voltage during the memory operation. The first voltage may be greater than the second voltage.

Figure 8A:
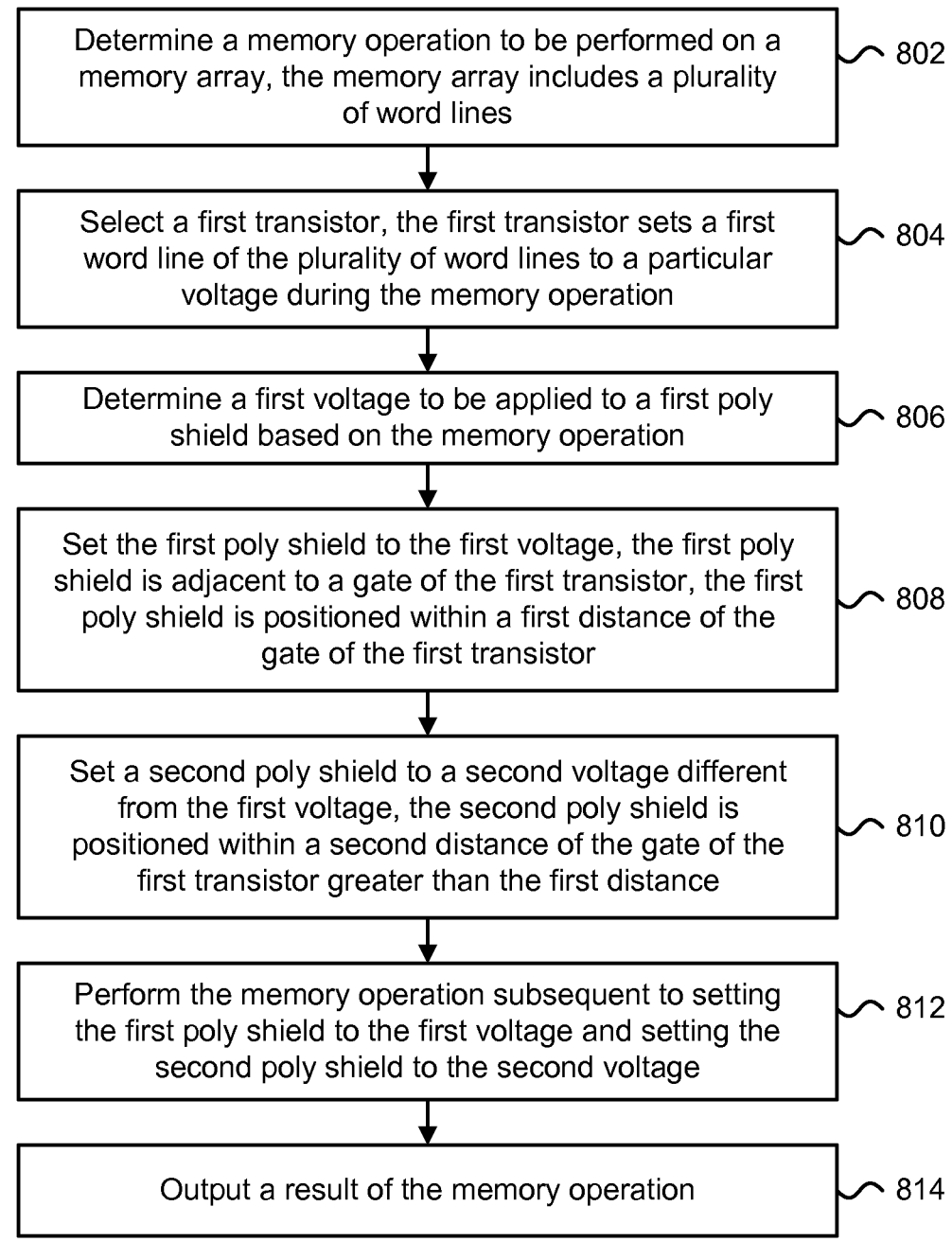
FIG. 8A is a flowchart describing one embodiment of a process for reducing an increase in the threshold voltage of a transistor due to the body effect.

FIG. 8A is a flowchart describing one embodiment of a process for reducing an increase in the threshold voltage of a transistor due to the body effect. In one embodiment, the process of FIG. 8A may be performed by control circuitry, such as control circuitry 510 in FIG. 5.

In step 802, a memory operation to be performed on a memory array is determined. The memory operation may comprise a programming operation, a verify operation, an erase operation, or a read operation. The memory operation may be determined based on a memory command received by a storage system, such as non-volatile storage system 596 in FIG. 5. The memory array may include a plurality of word lines. In one embodiment, the memory array may comprise a NAND memory array. In another embodiment, the memory array may comprise a three-dimensional memory array.

In step 804, a first transistor is selected or identified. The first transistor may comprise a word line switch transistor for transferring a voltage to a first word line of the plurality of word lines. The first transistor may set a first word line of the plurality of word lines to a particular voltage during the memory operation. In step 806, a first voltage to be applied to a first poly shield is determined based on the memory operation (or the type of memory operation to be performed).

In one embodiment, the first voltage applied to the first poly shield may depend on whether the memory operation comprises a programming operation, an erase operation, or a read operation. As higher voltages may be transferred to word lines during a programming operation than during a read operation (e.g., the highest word line voltage may be 24V during a programming operation and the highest word line voltage may be 6V during a read operation), the first voltage may be set to a higher voltage value during a programming operation than the voltage value used during a read operation. In some cases, the first voltage may be determined via a lookup-table or configuration information stored in a non-volatile memory based on the type of memory operation to be performed.

In another embodiment, the first voltage applied to the first poly shield may depend on the lowest voltage that is applied to any of the plurality of word lines during the memory operation. In this case, the lowest voltage that is applied to any of the plurality of word lines may determine the highest voltage value that may be applied to the first poly shield due to field punch-through concerns. In another embodiment, the first voltage applied to the first poly shield may depend on the difference between the highest voltage applied to any of the plurality of word lines (e.g., a programming voltage, such as 24V) and the lowest voltage applied to any of the plurality of word lines (e.g., an isolation voltage, such as 0V) during the memory operation. The difference between the highest voltage and the lowest voltage may dictate the highest voltage value that the first poly shield may be biased to due to field punch-through concerns.

In another embodiment, the first voltage applied to the first poly shield may depend on the highest voltage that is applied to any of the plurality of word lines during the memory operation. In this case, the highest voltage that is applied to any of the plurality of word lines may determine the lowest voltage value that may be applied to the first poly shield due to concerns regarding the increase in threshold voltage due to the body effect affecting transfer of the highest voltage. In one example, during a programming operation, the threshold voltage of a word line switch transistor may increase by 3V when transferring 24V to the word line. In these cases, the first voltage may be determined via configuration information or a lookup-table stored in a non-volatile memory (e.g., configured and stored during wafer sort, die sort, or after packaging) that may be used to lookup or determine the first voltage to be applied to the first poly shield based on the lowest voltage that is to be applied to any of the plurality of word lines during the memory operation, the highest voltage that is to be applied to any of the plurality of word lines during the memory operation, or the difference between the highest voltage and the lowest voltage applied to the plurality of word lines during the memory operation.

In some cases, the first voltage applied to the first poly shield may be determined based on the highest voltage and the lowest voltage to be applied to the plurality of word lines during the memory operation, and based on a temperature of an integrated circuit (e.g., determined using a temperature sensor located on the integrated circuit). As temperature affects the threshold voltages of transistors (e.g., threshold voltages may decrease with increasing temperature) and electron mobility, the first voltage applied to the first poly shield may be adjusted based on temperature.

In step 808, the first poly shield is set to the first voltage. The first poly shield may comprise a polysilicon shield, such as polysilicon shield 754 in FIG. 7E. The first poly shield may be adjacent to a gate of the first transistor. The first poly shield may be positioned within a first distance of the gate of the first transistor. In some cases, the first poly shield may be directly adjacent to the gate of the first transistor, such that no intervening polysilicon structure exists between the first poly shield and the gate of the first transistor.

In step 810, a second poly shield is set to a second voltage different from the first voltage. The second voltage may be less than the first voltage. The second poly shield may comprise a second polysilicon shield, such as polysilicon shield 746 in FIG. 7E. The second poly shield may be positioned within a second distance of the gate of the first transistor. The second distance may be greater than the first distance.

In some embodiments, the first transistor may comprise an NMOS transistor that transfers a first voltage to the first word line during a programming operation. In this case, the first poly shield may comprise a first polysilicon structure that is directly adjacent to the gate of the first transistor. The first poly shield may be arranged in a first direction (e.g., in the channel length direction of the first transistor) and the second poly shield may be arranged in a second direction that is orthogonal to the first direction (e.g., in the channel width direction of the first transistor).

In step 812, the memory operation is performed subsequent to setting the first poly shield to the first voltage and subsequent to setting the second poly shield to the second voltage. During the memory operation, the first poly shield may be biased to the first voltage (e.g., 10V and the second poly shield may be biased to a second voltage less than the first voltage (e.g., 0V). In step 814, a result of the memory operation is outputted. In one embodiment, if the memory operation comprises a read operation, then the result of the memory operation may comprise data read from the memory array. In another embodiment, if the memory operation comprises a programming operation, then the result of the memory operation may comprise data associated with whether the programming operation was successful or an error flag indicating that an error occurred during the programming operation.

Figure 8B:
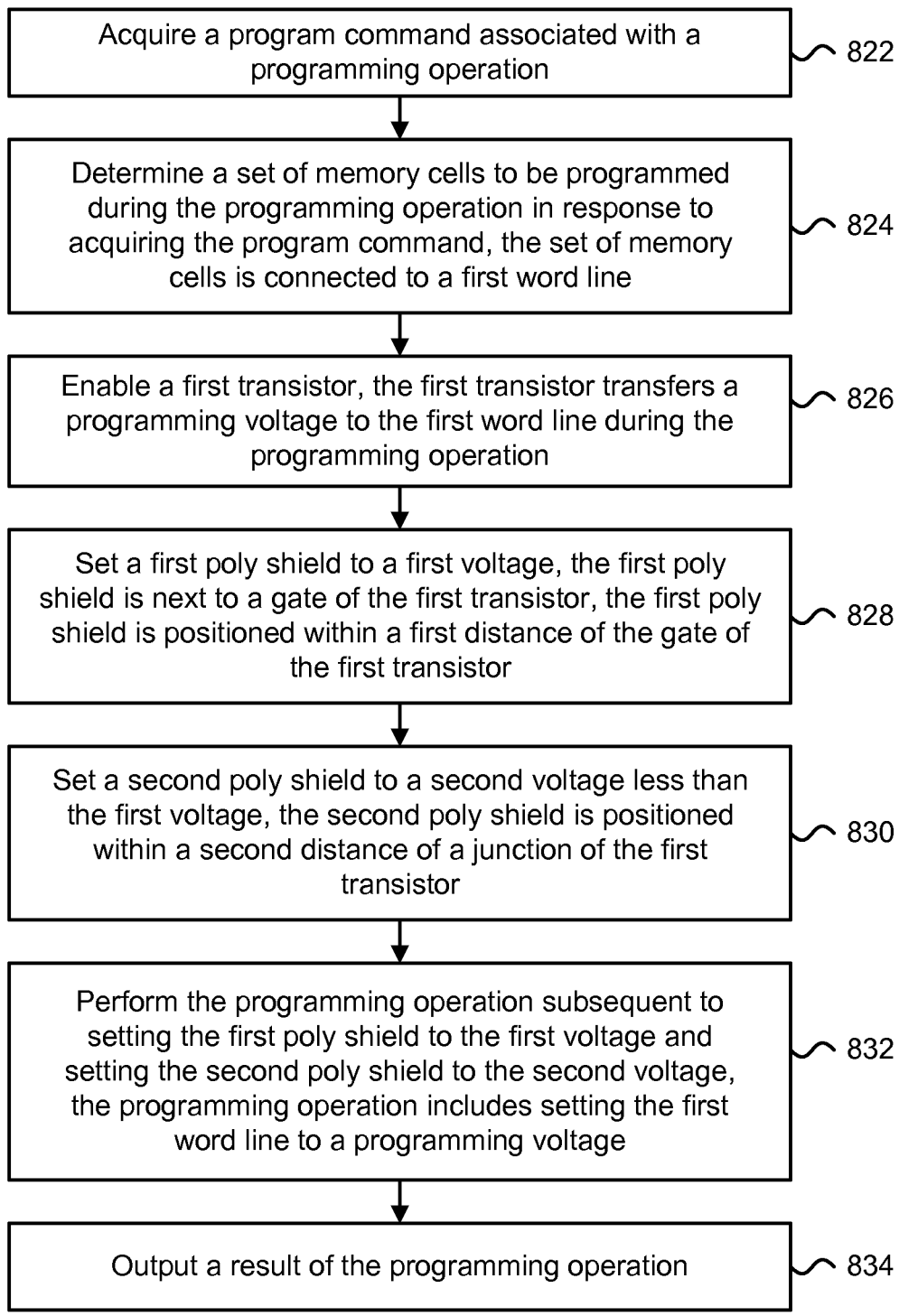
FIG. 8B is a flowchart describing an alternative embodiment of a process for reducing an increase in the threshold voltage of a transistor due to the body effect.

FIG. 8B is a flowchart describing an alternative embodiment of a process for reducing an increase in the threshold voltage of a transistor due to the body effect. In one embodiment, the process of FIG. 8B may be performed by control circuitry, such as control circuitry 510 in FIG. 5.

In step 822, a program command associated with a programming operation is acquired. The programming operation may derive from the program command being received by a storage system, such as non-volatile storage system 596 in FIG. 5. In step 824, a set of memory cells to be programmed during the programming operation is determined in response to acquiring the program command. The set of memory cells may be connected to a first word line. The set of memory cells may correspond with storage elements in a memory array in which a page of data is to be programmed. The memory array may comprise a NAND memory array or three-dimensional memory array.

In step 826, a first transistor is enabled or set into a conducting state. The first transistor may comprise a word line switch transistor. The first transistor may transfer a programming voltage to the first word line during the programming operation. In step 828, a first poly shield is set to a first voltage. The first poly shield may be positioned next to a gate of the first transistor. The first poly shield may be positioned within a first distance of the gate of the first transistor. In one embodiment, the first poly shield may be positioned within a minimum poly to poly spacing distance of the gate of the first transistor.

In step 830, a second poly shield is set to a second voltage less than the first voltage. The second poly shield may be positioned within a second distance of a junction of the first transistor. In one embodiment, the second poly shield may be positioned within a minimum poly to diffusion spacing distance of the junction of the first transistor.

In step 832, the programming operation is performed subsequent to setting the first poly shield to the first voltage. The first poly shield may be biased to the first voltage throughout the programming operation. In some embodiments, the programming operation may be performed subsequent to setting the first poly shield to the first voltage and subsequent to setting the second poly shield to the second voltage. The programming operation may include setting the first word line to a programming voltage (e.g., 24V). In step 834, a result of the programming operation is outputted. The result of the programming operation may comprise data associated with whether the programming operation was successful or an error flag indicating that an error occurred during the programming operation.

In one embodiment, the set of memory cells may comprise a portion of a memory array. The memory array may comprise a plurality of word lines including the first word line. The first voltage applied to the first poly shield may depend on the lowest voltage that is applied to any of the plurality of word lines during the programming operation. In one example, if an isolation voltage (e.g., 0V) is applied to one of the plurality of word lines during the programming operation, then the first voltage may be set to 6V. However, if an isolation voltage is not applied to any of the plurality of word lines during the programming operation and each voltage applied to each of the plurality of word lines during the programming operation is greater than a particular voltage (e.g., greater than or equal to 6V), then the first voltage may be set to 14V or another voltage that is greater than the voltage applied to the first word line when one of the plurality of word lines is set to an isolation voltage during the programming operation.

One embodiment of the disclosed technology includes determining a memory operation to be performed on a memory array. The memory array includes a plurality of word lines. The method further comprises determining a first voltage to be applied to a first poly shield based on the memory operation. The first poly shield is adjacent to a polysilicon gate of a first transistor. The method further comprises setting the first poly shield to the first voltage and performing the memory operation. The performing the memory operation includes setting a first word line of the plurality of word lines to a word line voltage using the first transistor subsequent to setting the first poly shield to the first voltage.

One embodiment of the disclosed technology includes a non-volatile storage system including a semiconductor memory array and one or more managing circuits in communication with the semiconductor memory array. The semiconductor memory array includes a plurality of word lines. The non-volatile storage system further including a word line switch transistor connected to a first word line of the plurality of word lines. The word line switch transistor includes a polysilicon gate. The non-volatile storage system further including a first poly shield. The first poly shield is located next to the polysilicon gate of the word line switch transistor such that there is no intervening polysilicon structure between the polysilicon gate and the first poly shield. The non-volatile storage system further including a shield biasing control circuit in communication with the first poly shield. The shield biasing control circuit configured to identify a memory operation to be performed on the semiconductor memory array, configured to determine a first voltage to be applied to the first poly shield based on the memory operation, and configured to set the first poly shield to the first voltage during the memory operation. The one or more managing circuits configured to cause the word line switch transistor to transfer a word line voltage to the first word line during the memory operation and subsequent to the first poly shield being set to the first voltage.

One embodiment of the disclosed technology includes acquiring a memory command associated with performing a memory operation on a memory array. The memory array includes a plurality of word lines. The method further comprises determining a first voltage to be applied to a first poly shield based on the memory operation. The first poly shield is located next to a polysilicon gate of a word line switch transistor such that there is no intervening polysilicon structure between the polysilicon gate and the first poly shield. The determining a first voltage includes determining the first voltage based on a lowest voltage to be applied to any of the plurality of word lines during the memory operation. The method further comprises biasing the first poly shield to the first voltage and performing the memory operation. The performing the memory operation includes transferring a word line voltage to a first word line of the plurality of word lines using the word line switch transistor. The transferring a word line voltage to the first word line is performed subsequent to the biasing the first poly shield to the first voltage. The biasing the first poly shield to the first voltage causes a reduction in a threshold voltage of the word line switch transistor during the memory operation.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for operating a non-volatile storage system, comprising:
    determining a memory operation to be performed on a memory array, the memory array includes a plurality of word lines;
    determining a first voltage to be applied to a first poly shield based on the memory operation, the first poly shield is adjacent to a polysilicon gate of a first transistor;
    setting the first poly shield to the first voltage; and
    performing the memory operation, the performing the memory operation includes setting a first word line of the plurality of word lines to a word line voltage using the first transistor subsequent to setting the first poly shield to the first voltage.

2. The method of claim 1, wherein:
    the determining a first voltage includes determining the first voltage based on a lowest voltage to be applied to any of the plurality of word lines during the memory operation.

3. The method of claim 1, wherein:
    the determining a first voltage includes determining the first voltage based on a highest voltage to be applied to any of the plurality of word lines during the memory operation.

4. The method of claim 1, wherein:
    the determining a first voltage includes determining a highest voltage to be applied to any of the plurality of word lines during the memory operation and determining a lowest voltage to be applied to any of the plurality of word lines during the memory operation, the determining a first voltage includes determining a voltage difference between the highest voltage and the lowest voltage and determining the first voltage based on the voltage difference.

5. The method of claim 1, wherein:
    the determining a first voltage includes determining whether the memory operation comprises a programming operation, an erase operation, or a read operation.

6. The method of claim 1, further comprising:
    setting a second poly shield to a second voltage different from the first voltage, the second poly shield is adjacent to the polysilicon gate of the first transistor, the performing the memory operation includes performing the memory operation subsequent to setting the first poly shield to the first voltage and subsequent to setting the second poly shield to the second voltage.

7. The method of claim 6, wherein:
    the first poly shield is positioned within a first distance of the polysilicon gate and the second poly shield is positioned within a second distance of the polysilicon gate greater than the first distance.

8. The method of claim 6, wherein:
    the first poly shield is arranged in a channel length direction of the first transistor and the second poly shield is arranged in a second direction that is orthogonal to the channel length direction of the first transistor.

9. The method of claim 1, wherein:
    the first poly shield is located next to the polysilicon gate of the first transistor such that there is no intervening polysilicon structure between the polysilicon gate and the first poly shield.

10. The method of claim 1, wherein:
    the memory array comprises a NAND memory array;
    the memory operation comprises a programming operation;

the word line voltage comprises a programming voltage; and the setting the first poly shield to the first voltage causes a reduction in a threshold voltage of the first transistor during the memory operation.

11. The method of claim 1, wherein:

the memory array comprises a non-volatile memory that is monolithically formed in one or more physical levels of memory cells having active areas disposed above a silicon substrate, the non-volatile storage system includes circuitry associated with the operation of the memory array.

12. The method of claim 1, wherein:

the memory array comprises a three-dimensional memory array.

13. A non-volatile storage system, comprising:

a semiconductor memory array, the semiconductor memory array includes a plurality of word lines;

a word line switch transistor connected to a first word line of the plurality of word lines, the word line switch transistor includes a polysilicon gate;

a first poly shield, the first poly shield is located next to the polysilicon gate of the word line switch transistor such that there is no intervening polysilicon structure between the polysilicon gate and the first poly shield;

a shield biasing control circuit in communication with the first poly shield, the shield biasing control circuit configured to identify a memory operation to be performed on the semiconductor memory array, the shield biasing control circuit configured to determine a first voltage to be applied to the first poly shield based on the memory operation, the shield biasing control circuit configured to set the first poly shield to the first voltage during the memory operation; and one or more managing circuits in communication with the semiconductor memory array, the one or more managing circuits configured to cause the word line switch transistor to transfer a word line voltage to the first word line during the memory operation and subsequent to the first poly shield being set to the first voltage.

14. The non-volatile storage system of claim 13, wherein:

the shield biasing control circuit configured to determine the first voltage based on a lowest voltage to be applied to any of the plurality of word lines during the memory operation.

15. The non-volatile storage system of claim 13, wherein:

the shield biasing control circuit configured to determine the first voltage based on a highest voltage to be applied to any of the plurality of word lines during the memory operation.

16. The non-volatile storage system of claim 13, further comprising:

a second poly shield, the second poly shield is located next to the polysilicon gate of the word line switch transistor such that there is no intervening polysilicon structure between the polysilicon gate and the second poly shield, the shield biasing control circuit configured to determine a second voltage different from the first voltage to be applied to the second poly shield based on the memory operation, the shield biasing control circuit configured to set the second poly shield to the second voltage during the memory operation.

17. The non-volatile storage system of claim 16, wherein:

the first poly shield is arranged in a channel length direction of the word line switch transistor and the second poly shield is arranged in a second direction that is orthogonal to the channel length direction of the word line switch transistor.

18. The non-volatile storage system of claim 13, wherein:

the semiconductor memory array comprises a non-volatile memory that is monolithically formed in one or more physical levels of memory cells having active areas disposed above a silicon substrate.

19. A method for operating a non-volatile storage system, comprising:

acquiring a memory command associated with performing a memory operation on a memory array, the memory array includes a plurality of word lines;

determining a first voltage to be applied to a first poly shield based on the memory operation, the first poly shield is located next to a polysilicon gate of a word line switch transistor such that there is no intervening polysilicon structure between the polysilicon gate and the first poly shield, the determining a first voltage includes determining the first voltage based on a lowest voltage to be applied to any of the plurality of word lines during the memory operation;

biasing the first poly shield to the first voltage; and performing the memory operation, the performing the memory operation includes transferring a word line voltage to a first word line of the plurality of word lines using the word line switch transistor, the transferring a word line voltage to the first word line is performed subsequent to the biasing the first poly shield to the first voltage, the biasing the first poly shield to the first voltage causes a reduction in a threshold voltage of the word line switch transistor during the memory operation.

20. The method of claim 19, wherein:

the memory operation comprises a programming operation;

the word line voltage comprises a programming voltage; and the memory array comprises a three-dimensional memory array.

* * * * *